(12) United States Patent
Thomas et al.

(10) Patent No.: US 10,215,447 B2
(45) Date of Patent: Feb. 26, 2019

(54) SPECTRALLY SELECTIVE SEMICONDUCTOR DIELECTRIC PHOTONIC SOLAR THERMAL ABSORBER

(71) Applicant: California Institute of Technology, Pasadena, CA (US)

(72) Inventors: Nathan H. Thomas, Pasadena, CA (US); Austin Minnich, San Marino, CA (US)

(73) Assignee: CALIFORNIA INSTITUTE OF TECHNOLOGY, Pasadena, CA (US)

( * ) Notice: Subject to any disclaimer, the term of this patent is extended or adjusted under 35 U.S.C. 154(b) by 258 days.

(21) Appl. No.: 15/142,802

(22) Filed: Apr. 29, 2016

(65) Prior Publication Data
US 2016/0320096 A1   Nov. 3, 2016

Related U.S. Application Data

(60) Provisional application No. 62/154,459, filed on Apr. 29, 2015, provisional application No. 62/316,429, filed on Mar. 31, 2016.

(51) Int. Cl.
*C23C 14/34*   (2006.01)
*F24J 2/48*   (2006.01)
*F24J 2/46*   (2006.01)
*C23C 14/06*   (2006.01)

(52) U.S. Cl.
CPC ......... *F24J 2/4652* (2013.01); *C23C 14/0694* (2013.01); *F24J 2/485* (2013.01); *C23C 14/34* (2013.01)

(58) Field of Classification Search
None
See application file for complete search history.

(56) References Cited

U.S. PATENT DOCUMENTS

| 4,334,523 | A | * | 6/1982 | Spanoudis | F24J 2/055 126/652 |
| 4,628,905 | A | * | 12/1986 | Mills | F24J 2/055 126/652 |
| 9,029,681 | B1 | * | 5/2015 | Nielson | F24J 2/06 136/246 |
| 2010/0229908 | A1 | * | 9/2010 | Van Steenwyk | H01L 35/30 136/206 |
| 2010/0313875 | A1 | * | 12/2010 | Kennedy | F24J 2/055 126/652 |

OTHER PUBLICATIONS

Cao, F., et al., A review of cermet-based spectrally selective solar absorbers. Energy & Environmental Science, 7(5):1615-1627, 2014.
(Continued)

*Primary Examiner* — John J Figueroa
(74) *Attorney, Agent, or Firm* — Gates & Cooper LLP

(57) ABSTRACT

A solar thermal absorber including a spectrally selective filter comprising a stack of dielectric layers and one or more semiconductor absorber layers. The dielectric layers are transparent to infrared radiation and have a refractive index contrast, and the semiconductor absorber layers have a band gap, such that the semiconductor absorber layers absorb at least a portion of the solar spectrum and the stack reflects infrared radiation.

19 Claims, 12 Drawing Sheets

(56) References Cited

OTHER PUBLICATIONS

Chou, Jeffrey B., et al., Enabling ideal selective solar absorption with 2d metallic dielectric photonic crystals. Advanced Materials, 26(47):8041-8045, 2014.
Yin, Y., et al., Direct current reactive sputtering cr-cr2o3 cermet solar selective surfaces for solar hot water applications. Thin Solid Films, 517(5):1601-1606, 2009.
Booth, D.C., et al., Stabilized CVD amorphous silicon for high-temperature photothermal solar-energy conversion. Solar Energy Materials, 2(1):107-124, 1979.
Ackley, D.E., et al., Silicon films as selective absorbers for solar energy conversion. Applied Optics, 16 (11):2806-2809, 1977.
Tikhonravov, Alexander V., et al., Application of the needle optimization technique to the design of optical coatings. Applied Optics, 35(28):5493-5508, 1996.
Cao, F., et al., A high-performance spectrally-selective solar absorber based on a yttria-stabilized zirconia cermet with high-temperature stability, Energy & Environmental Science 8(10): 3040-3048, 2015.

* cited by examiner

SPECTRALLY SELECTIVE SEMICONDUCTOR DIELECTRIC PHOTONIC SOLAR THERMAL ABSORBER

CROSS REFERENCE TO RELATED APPLICATIONS

This application claims the benefit under 35 U.S.C. Section 119(e) of U.S. Provisional Patent Application Ser. No. 62/154,459, filed on Apr. 29, 2015, by Nathan H. Thomas and Austin Minnich, entitled "SPECTRALLY SELECTIVE SEMICONDUCTOR DIELECTRIC PHOTONIC SOLAR THERMAL ABSORBER," CIT-7174-P;

which application is incorporated by reference herein.

This application claims the benefit under 35 U.S.C. Section 119(e) of U.S. Provisional Patent Application Ser. No. 62/316,429, filed on Mar. 31, 2016, by Nathan H. Thomas and Austin Minnich, entitled "SPECTRALLY SELECTIVE SEMICONDUCTOR DIELECTRIC PHOTONIC SOLAR THERMAL ABSORBER," CIT-7174-P2.

STATEMENT REGARDING FEDERALLY SPONSORED RESEARCH AND DEVELOPMENT

This invention was made with government support under Grant No. DE-SC0001293 awarded by the Department of Energy. The government has certain rights in the invention.

BACKGROUND OF THE INVENTION

1. Field of the Invention

This invention relates to thermal absorbers.

2. Description of the Related Art (Note: This application references a number of different publications as indicated throughout the specification by one or more reference numbers within brackets, e.g., [x]. A list of these different publications ordered according to these reference numbers can be found below in the section entitled "References." Each of these publications is incorporated by reference herein.)

There is a need for solar thermal absorbers that efficiently generate thermal energy in response to absorbing electromagnetic radiation from the sun. One or more embodiments of the present invention satisfy this need.

SUMMARY OF THE INVENTION

An efficient spectrally selective solar thermal absorber according to one or more embodiments of the present invention functions by maximizing the absorption of visible light from the sun, while simultaneously minimizing the infra-red (IR) emission of the absorber's own black-body radiation.

In one or more embodiments, the absorber comprises a stack of dielectric layers and one or more semiconductor absorber layers (e.g., sputtered) on a metal reflector. The dielectric layers (comprising, e.g., zinc sulfide (ZnS) and calcium fluoride ($CaF_2$) are transparent to infrared radiation and have sufficient refractive index contrast for anti-reflection of visible light, and the semiconductor absorber layers (e.g., amorphous silicon (Si) or amorphous germanium (Ge)) have a (e.g., a direct or indirect) band gap, such that the semiconductor absorber layers absorb at least a portion of the solar spectrum (visible light and near infrared radiation) and the stack reflects infrared radiation. The metal reflector can comprise silver (Ag) sandwiched between chromium (Cr) layers The stack according to one or more embodiments of the invention can comprise a spectrally selective filter that filters electromagnetic radiation received from, e.g., the sun, the electromagnetic radiation comprising in-band electromagnetic radiation having in-band wavelengths (at least a portion of the solar spectrum) and out-of-band electromagnetic radiation having out-of-band wavelengths (e.g., including infrared wavelengths). The out-of-band wavelengths are at or above the critical wavelength defined such that black-body radiation having the out-of-band wavelengths is emitted from the semiconductor absorber layers with an intensity that exceeds an intensity of the out-of-band electromagnetic radiation absorbed by the semiconductor absorber layers.

The filter (e.g., Fabry Perot Filter or photonic bandgap filter) can be designed so that at least some of the out-of-band wavelengths lie in the filter's stop band(s) and at least some of the in-band wavelengths lie in the filter's pass band(s). For example, the dielectric layers can be transparent to infrared (IR) electromagnetic radiation and have a refractive index contrast, and the semiconductor absorber layers can have a band gap, such that (1) absorptance of the stack decreases by at least 80%, as the electromagnetic radiation's wavelength is increased over a wavelength range of no more than 500 nanometers centered on a boundary between the filter's absorptance stop-band and the filter's absorptance pass-band; and (2) reflectance of the stack increases by at least 80%, as the electromagnetic radiation's wavelength is increased over a wavelength range of no more than 100 nanometers centered on a boundary between the filter's reflectance stop-band and the filter's reflectance pass-band. In one or more embodiments, the boundaries (between an absorptance stop band and an absorptance pass band, or between a reflectance pass band and a reflectance stop band) are no more than 500 nm less (or no more than 200 nm less) than the critical wavelength (e.g., 1.6 micrometers or 1.8 micrometers), so as to increase the amount of in-band wavelengths that lie in the pass-band (absorptance range) of the filter. For example, for the devices comprising amorphous germanium, the boundary between the stop and pass bands for absorptance and reflectance is at a wavelength of 1.6 micrometers, and the critical wavelength is at 1.8 micrometers.

In this way, the filter can suppress emission of the black-body radiation while allowing the semiconductor absorber layers to generate thermal energy by increasing in temperature in response to absorbing the in-band electromagnetic radiation.

In one or more embodiments, the stack can comprise one or more first dielectric layers comprising a first dielectric material and one or more second dielectric layers comprising a second dielectric material, a first region including one of the first dielectric layers between two of the second dielectric layers, a second region including layers alternating between one of the second dielectric layers and one of the semiconductor absorbing layers, and a metal reflector positioned such that the second region is between the first region and the metal reflector, and wherein the electromagnetic radiation is incident on the first region.

In one or more embodiments, the semiconductor absorber layer closest to the metal reflector and the semiconductor absorber layer closest to the first region are both thinner than the remaining semiconductor absorber layers, and/or the dielectric layer closest to the metal reflector, and the dielectric layer closest to a top surface of the first region on which the electromagnetic radiation is incident, are both thicker than the remaining dielectric layers.

In one or more embodiments, the first dielectric layer can comprise at least one dielectric selected from ZnS and ZnSe, the second dielectric layer can comprise at least one dielectric selected from $CaF_2$ and KBr, and the semiconductor absorber layer can comprise at least one semiconductor selected from amorphous silicon, amorphous germanium, and GaSb.

In one or more embodiments, the dielectric layers comprise a ZnS layer (e.g., thickness of 1-50 nm), a first $CaF_2$ layer (e.g., thickness of 50-300 nm), a second $CaF_2$ layer (e.g., thickness between 10-70 nm), a third $CaF_2$ layer (e.g., thickness between 10-70 nm), and a fourth $CaF_2$ layer (e.g., thickness of 50-100 nm); the semiconductor absorber layers comprise a first semiconductor absorber layer (e.g., thickness of 20-80 nm), a second semiconductor absorber layer (e.g., thickness of 20-100 nm), and a third semiconductor absorber layer (e.g., thickness of 1-70 nm); the first semiconductor absorber layer is on the metal reflector; the first $CaF_2$ layer is on the first semiconductor absorber layer; the second semiconductor absorber layer is on the first $CaF_2$ layer; the second $CaF_2$ layer is on the second semiconductor absorber layer; the third semiconductor absorber layer is on the second $CaF_2$ layer; the third $CaF_2$ layer is on the third semiconductor absorber layer; the ZnS layer is on the third $CaF_2$ layer; and the fourth $CaF_2$ layer is on the ZnS layer. The metal reflector can be a silver reflector sandwiched between chromium (Cr) layers.

In one or more embodiments, the dielectric layers comprise a first $CaF_2$ layer, a second $CaF_2$ layer, a third $CaF_2$ layer, a fourth $CaF_2$ layer, a fifth $CaF_2$ layer, and a ZnS layer; the semiconductor absorber layers are amorphous Germanium layers comprising a first semiconductor absorber layer, a second semiconductor absorber layer, a third semiconductor absorber layer, and a fourth semiconductor absorber layer; the first semiconductor absorber layer is on or above metal layers comprising a silver layer sandwiched between chromium layers; the first $CaF_2$ layer is on the first semiconductor absorber layer; the second semiconductor absorber layer is on the first $CaF_2$ layer; the second $CaF_2$ layer is on the second semiconductor absorber layer; the third semiconductor absorber layer is on the second $CaF_2$ layer; the third $CaF_2$ layer is on the third semiconductor absorber layer; the fourth semiconductor absorber layer is on the third $CaF_2$ layer; the fourth $CaF_2$ layer is on the fourth semiconductor absorber layer; the ZnS layer is on the fourth $CaF_2$ layer; and the fifth $CaF_2$ layer is on the ZnS layer.

BRIEF DESCRIPTION OF THE DRAWINGS

Referring now to the drawings in which like reference numbers represent corresponding parts throughout.

DETAILED DESCRIPTION OF THE INVENTION

In the following description of the preferred embodiment, reference is made to the accompanying drawings which form a part hereof, and in which is shown by way of illustration a specific embodiment in which the invention may be practiced. It is to be understood that other embodiments may be utilized and structural changes may be made without departing from the scope of the present invention.

Technical Description

Figure 1:
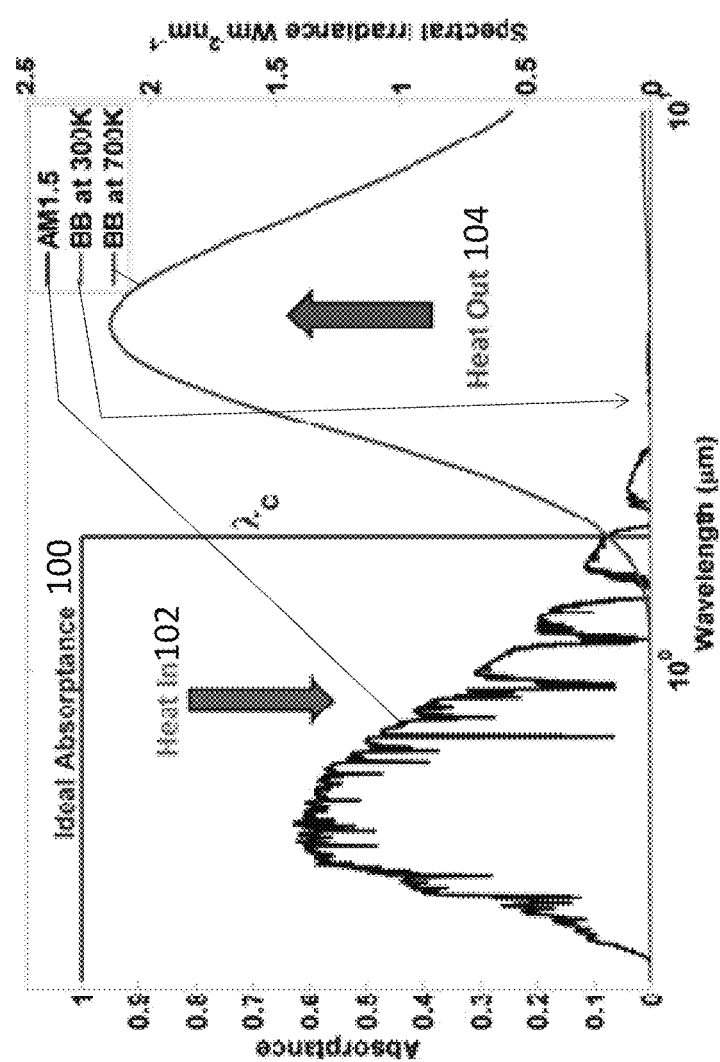
FIG. 1 illustrates the balance of heat flux, showing the solar spectrum is the primary source of energy flux into an absorber, which is balanced by the absorber's black-body radiation (flux out).

As shown in FIG. 1, at wavelengths longer than a critical wavelength $\lambda_c$, the intensity of light emitted by an absorber exceeds the intensity of light absorbed from the sun. At this critical wavelength, it benefits to cease absorbing/emitting light and to instead reflect it. The emission coefficient (emittance, $\varepsilon$) of light, which is equal to the absorption coefficient (absorptance, $\alpha$) by Kirchoff's law of thermal radiation, should drop sharply to zero. The ideal absorptance profile 100, heat in 102, heat out 104, are shown in FIG. 1, together with the Air Mass (AM) 1.5 spectrum, and Black Body (BB) spectra at 300 Kelvin (BB at 300K) and 700 K (BB at 700K).

The current state of the art employs metal-ceramic mixtures (cermets) or 2-D patterned metal-dielectric photonic crystals (MDPhCs) [1, 2]. Reference [7] describes a layered device where each layer is a metal (tungsten), a ceramic-metal mixture (cermets, W—Ni—YSZ with two different compositions, where YSZ is Yttria-Stabilized Zirconia), or a ceramic (YSZ) (the device in [7] falls under the category of "cermet" selective surfaces). However, because metals are imperfect reflectors in the IR, these cermets and MDPhCs exhibit a rather gradual drop in absorptance as shown by the curves labelled [2] and [3] in FIG. 3 and by the curves labelled [2], [3], and [7] in FIG. 11. Consequently, current solar thermal absorbers are largely inefficient and require high concentration of sunlight to achieve high-temperatures. As an alternative to metal-based structures, semiconductor-based absorbers take advantage of the inherent spectral selectivity in semiconductors, which are naturally transparent to light with energies below the bandgap. However, previous attempts to use semiconductors for solar-thermal absorption employ rather simple designs which do not maximally absorb incident sunlight [4].

First Example

Figure 2:
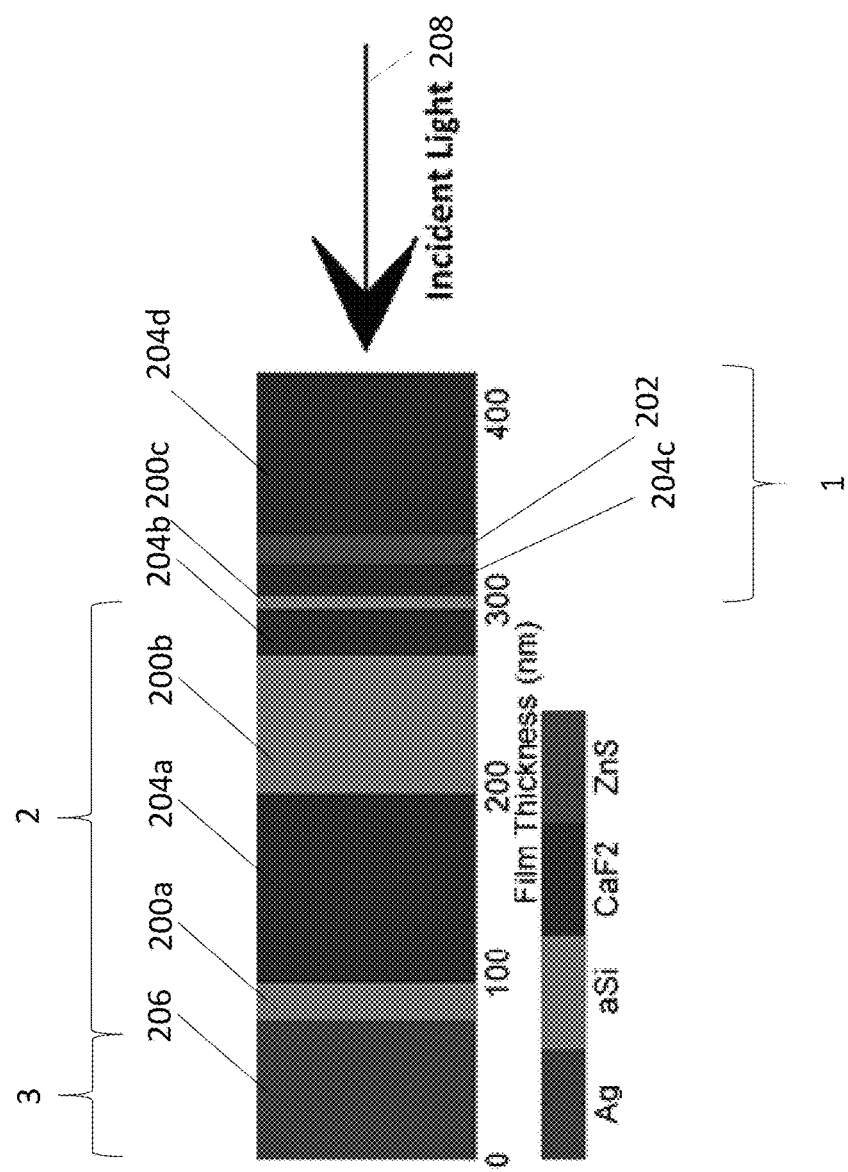
FIG. 2 illustrates a film profile for an optimized semiconductor dielectric photonic solar thermal absorber according to one or more embodiments of the present invention, showing film thickness in nanometers (nm).

FIG. 2 is a diagram of the optimized profile of a semiconductor-dielectric solar thermal absorber according to one or more embodiments of the invention, comprising a stack of layered thin films of amorphous silicon (aSi) (layers 200a, 200b, 200c), polycrystalline ZnS (layer 202), and $CaF_2$ (layers 204a, 204b, 204c, and 204d), sputtered on top of a silver (Ag) infrared back reflector (layer 206). In one or more embodiments, an adhesion layer of chromium (Cr) separating the Ag layer from the surrounding semiconductor layers is used to stabilize the stack at high temperature (see e.g., example 3 below). The direction of incident light 208 is also shown.

Figure 3:
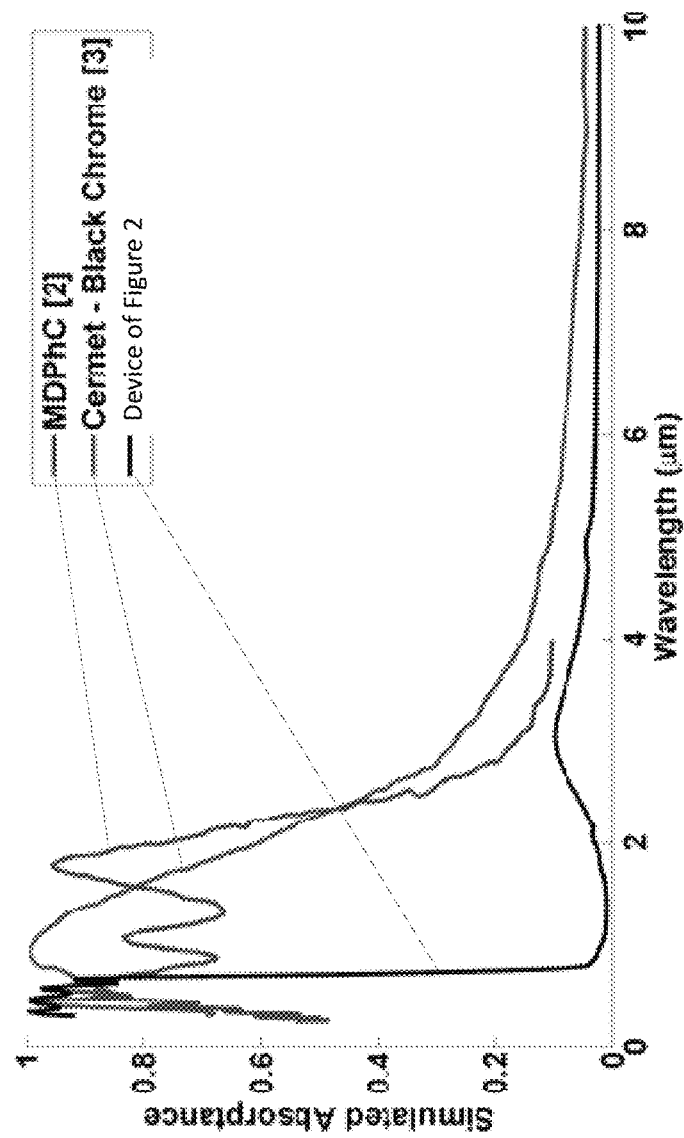
FIG. 3 illustrates simulated absorptance of a device having the structure of FIG. 2, as compared to absorptance of the metal-dielectric photonic crystal by Chou et al. [2] and the black chrome metal-ceramic coating by Yin et al. [3].

FIG. 3 shows a simulation of the device having the structure of FIG. 2 (according to one or more embodiments of the invention). As can be seen in FIG. 3, the room temperature absorptance spectrum of this device exhibits improved IR reflectance, higher visible absorption, and a sharper absorptance cutoff than both the cermet and MDPhC devices. The room-temperature optical-gap of amorphous silicon corresponds to a wavelength of around 750 nm, depending on the deposition technique, which inauspiciously causes the absorption cutoff to be quite far to the left of (i.e., at a smaller wavelength than) the critical wavelength of about 1.6 μm. However, semiconductor band gaps generally narrow as temperature goes up (see Ackley et al. showing that the optical gap of aSi narrows to around 1.5 μm at elevated temperatures [5]). Superior performance for one or more embodiments of the invention is thus expected at higher temperatures as well.

Figure 4:
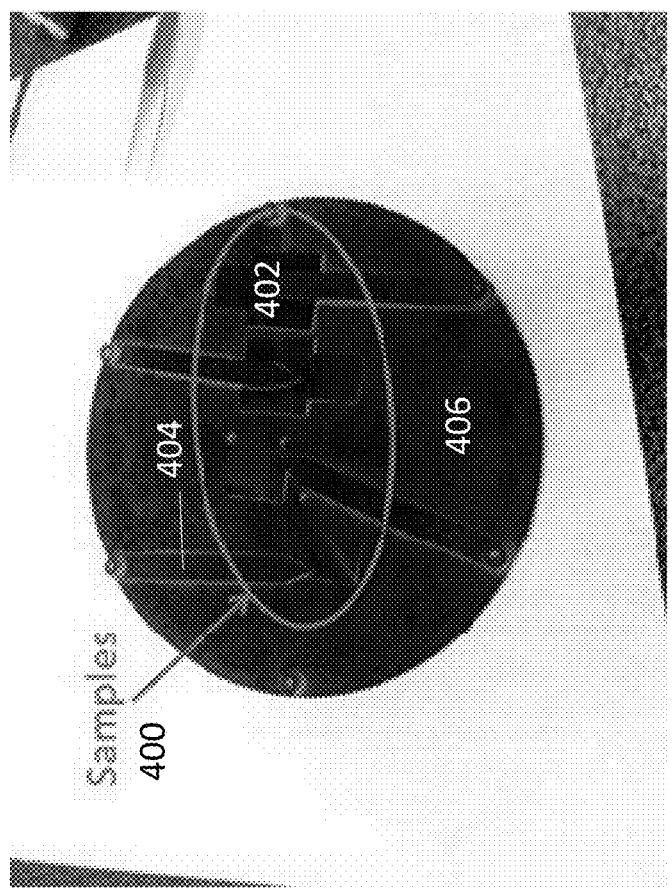
FIG. 4 is photograph showing sputtered samples on the sputtering chuck, the sample having the structure of FIG. 2.
Figure 5:
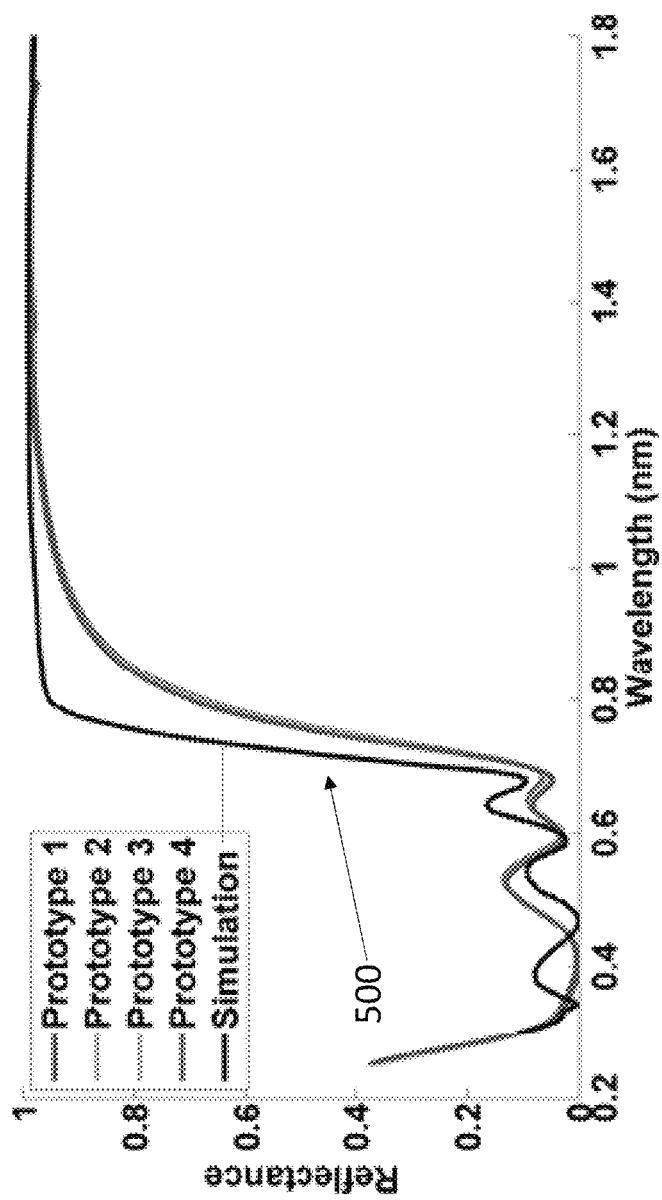
FIG. 5 illustrates reflectance of a plurality of sputtered devices (prototype 1, prototype 2, prototype 3, and prototype 4) having the structure of FIG. 2, measured using UV-Vis spectroscopy, wherein theory (simulation curve) and experiment (curves for prototypes 1-4) both show the superior spectral selectivity of the sputtered devices.

FIG. 4 shows an image of the sputtered samples 400 (wherein 402 shows an individual sample and 404 is a clip holding the sample to the sputtering chuck 406) and FIG. 5 shows the samples' measured Ultraviolet-visible (UV-VIS) spectrum (the samples having the structure of FIG. 2). The UV-VIS spectrum shows the measured reflectance R, but as the samples are opaque, absorptance is simply α=1−R. As is evident in FIG. 5, the experimental profile matches the simulated result quite well, indicating that semiconductor dielectric photonic structures show promising and unprecedented spectral selectivity.

Second Example (Using Amorphous Germanium)

Considerable improvements are also made by using amorphous germanium instead of amorphous silicon, because amorphous germanium has an optical gap which is corresponds to a wavelength which is closer to the critical wavelength.

Figure 6:
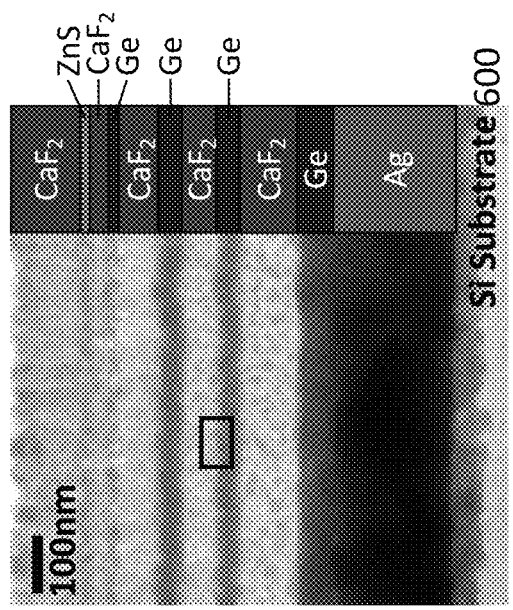
FIG. 6 is a transmission electron microscope (TEM) image of a semiconductor-dielectric solar thermal absorber according to one or more embodiments of the invention, comprising a stack of layered thin films of amorphous germanium and polycrystalline ZnS and $CaF_2$, sputtered on top of a silver (Ag) infrared back reflector.

FIG. 6 illustrates a semiconductor-dielectric solar thermal absorber according to one or more embodiments of the invention, comprising a stack of layered thin films of amorphous germanium (Ge) and polycrystalline ZnS and $CaF_2$, sputtered on top of a silver (Ag) infrared back reflector. The device is on a silicon (Si) substrate 600.

Figure 7:
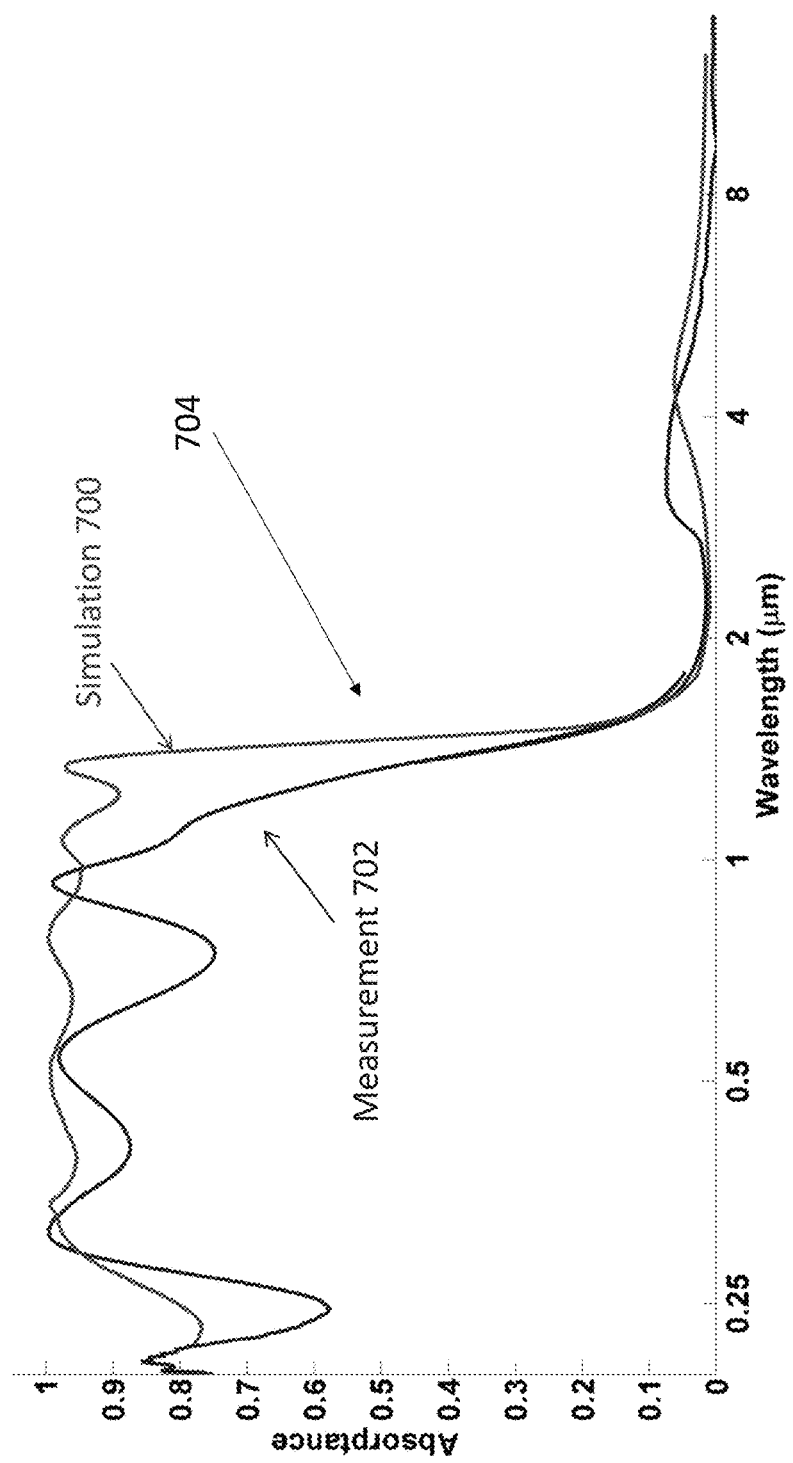
FIG. 7 illustrates simulated and measured absorptance profile (absorptance as a function of wavelength of incident electromagnetic radiation) of the device having the structure of FIG. 6.

FIG. 7 illustrates simulated (simulation 700) and measured (measurement 702) absorptance profile (absorptance as a function of wavelength of incident electromagnetic radiation) of the device having the structure of FIG. 6.

Third Example

Figure 8:
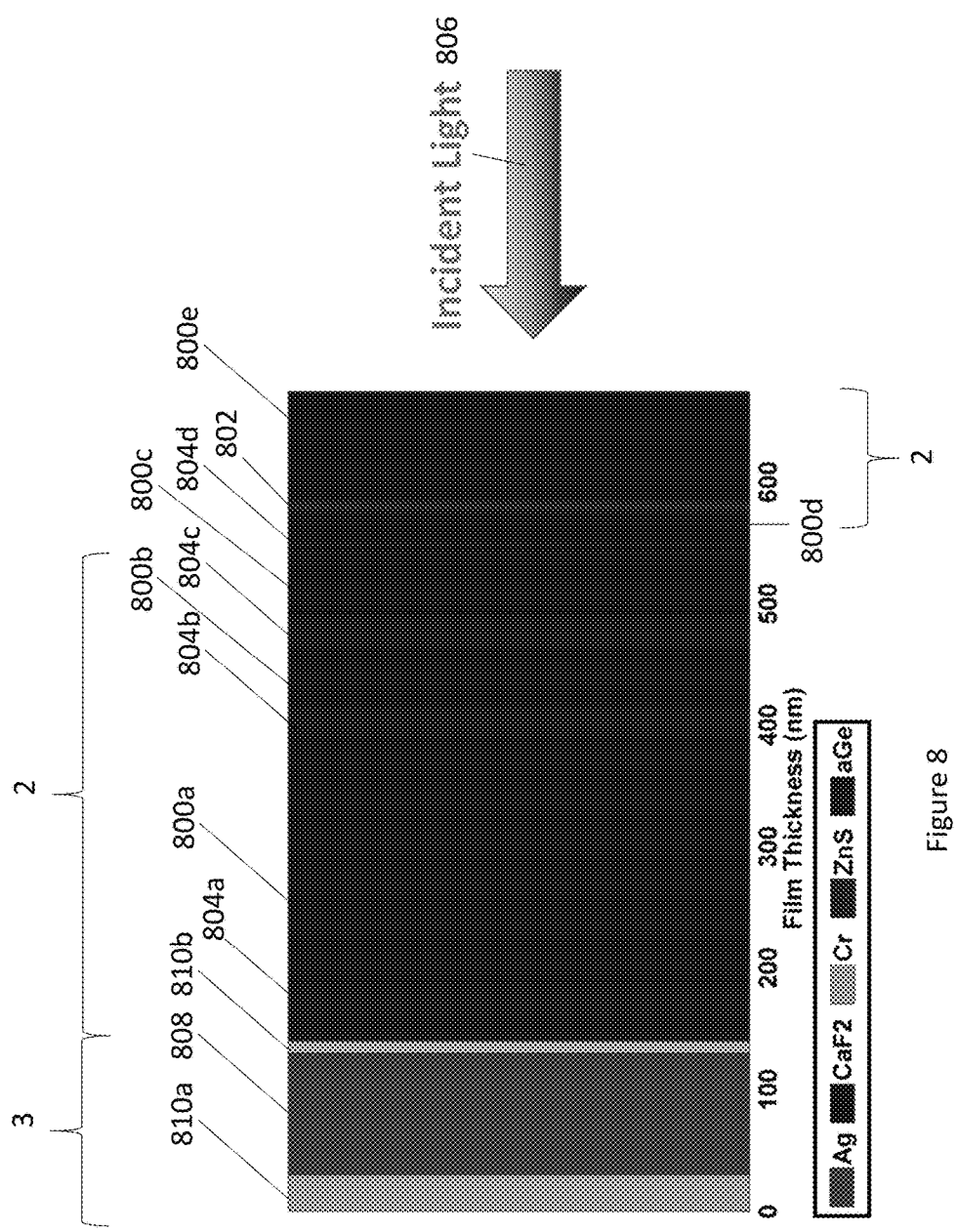
FIG. 8 is a cross-sectional schematic of a 1-D photonic stack comprising a semiconductor-dielectric solar absorber according to one or more embodiments of the invention, wherein the semiconductor absorber comprises amorphous germanium and the metal Ag layer is sandwiched between Cr layers and film thickness in nm is shown.

In one or more embodiments, Cr layers can be added on both sides of/around the metal (e.g., Ag) layer. FIG. 8 illustrates a solar thermal absorber, comprising a stack of dielectric layers ($CaF_2$ layers 800a, 800b, 800c, 800d, and 800e, and ZnS layer 802) and semiconductor absorber layers comprising amorphous Ge (aGe) layers 804a, 804b, 804c, and 804d. Light 806 is incident on the stack and the stack is on metal comprising Ag 808 sandwiched between Cr layers 810a, 810b.

Figure 9:
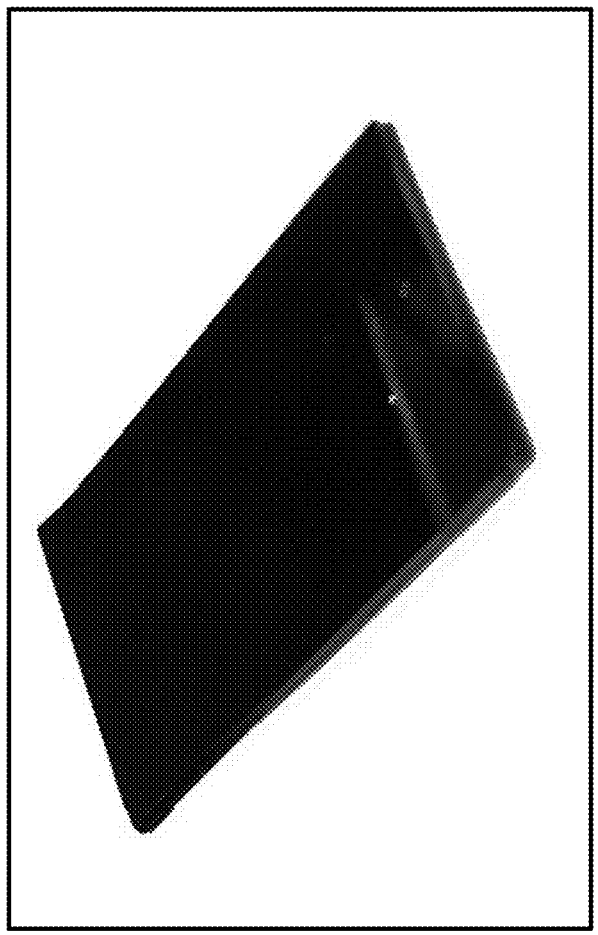
FIG. 9 is a photograph of a fabricated semiconductor-dielectric solar thermal absorber having the structure of FIG. 8, wherein the darkness means the device strongly absorbs visible light.

FIG. 9 illustrates the fabricated semiconductor-dielectric solar thermal absorber having the structure of FIG. 8, wherein the darkness means the device strongly absorbs visible light.

Figure 10:
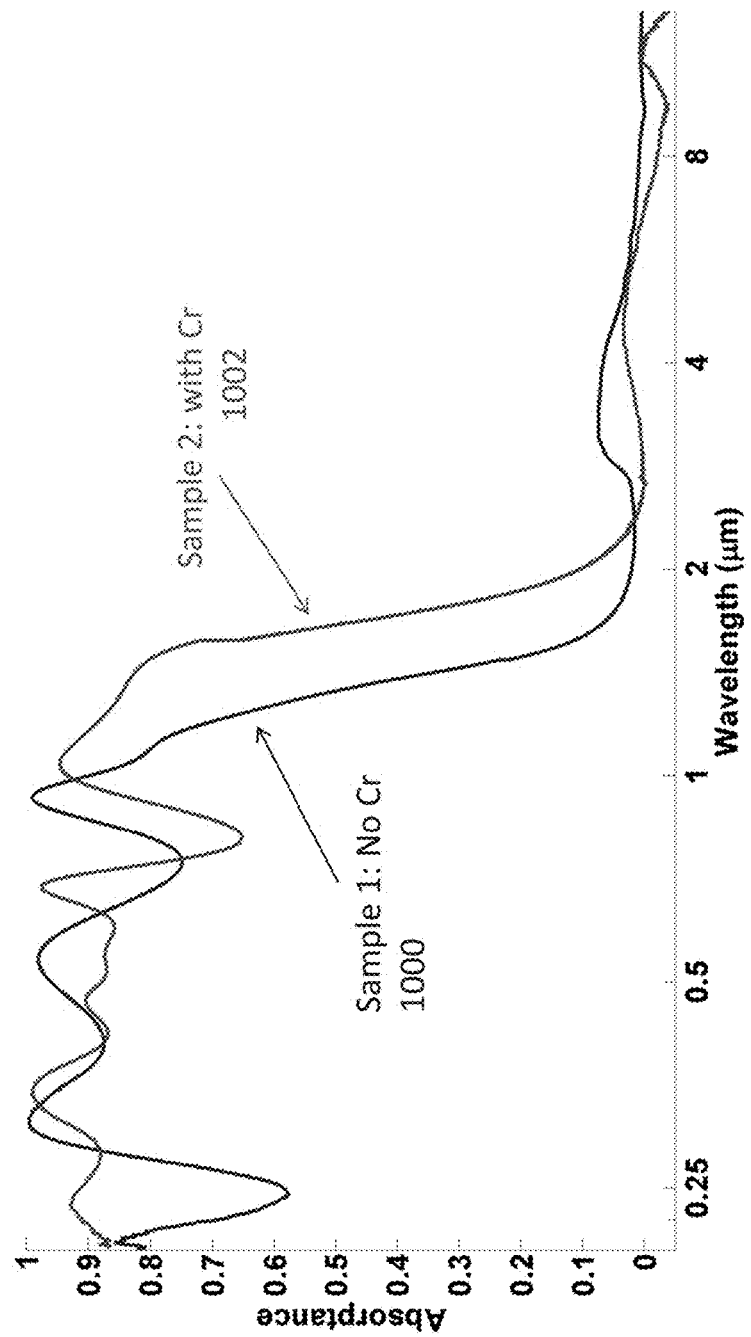
FIG. 10 illustrates the measured profile (absorptance as a function of wavelength of incident electromagnetic radiation) for the device of Example 2, FIG. 6 (Sample 1, no Cr) and the device of Example 3, FIG. 8 (Sample 2, including Cr).

FIG. 10 illustrates the measured profile (absorptance as a function of wavelength of incident electromagnetic radiation) for the device of Example 2 having the structure of FIG. 6 (Sample 1, no Cr) 1000 and the device of Example 3 having the structure of FIG. 8 (Sample 2, including Cr) 1002.

Figure 11:
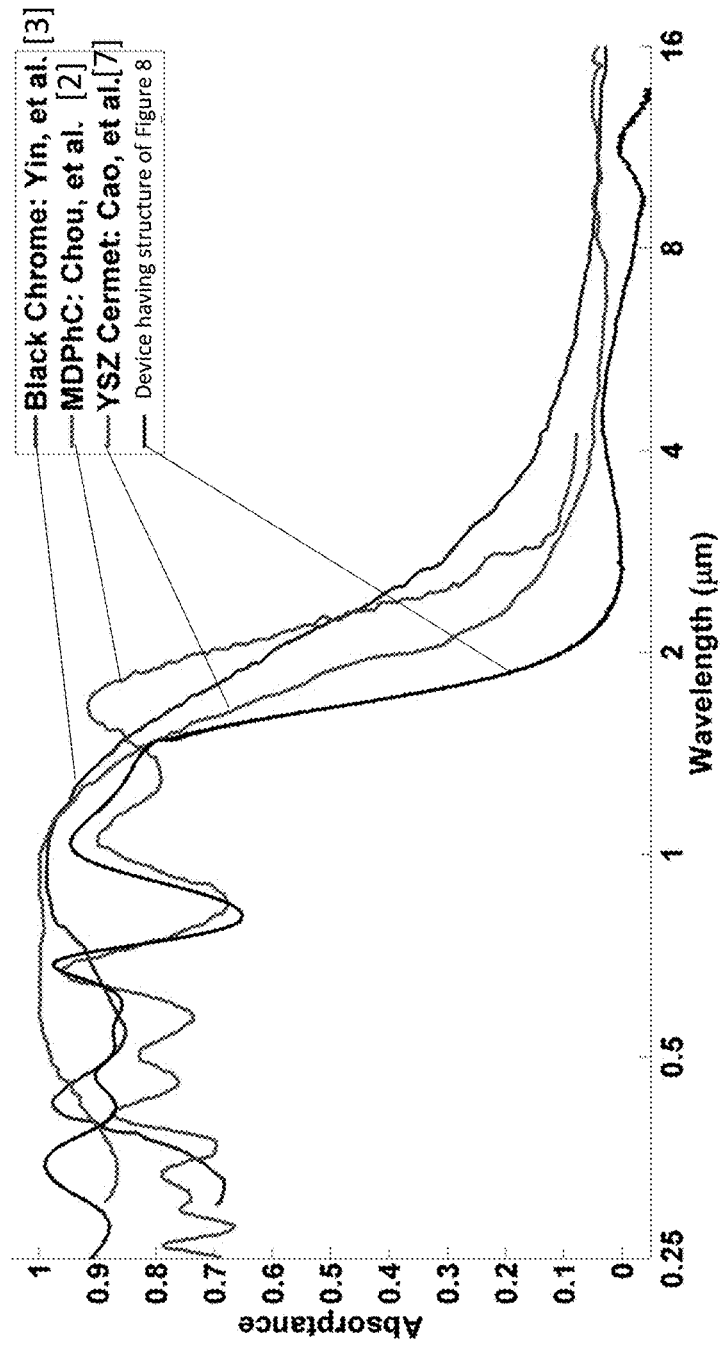
FIG. 11 is a graph comparing the performance of devices according to references [2], [3], and [7], with the performance of the device of the embodiment having the structure of FIG. 8.

FIG. 11 compares the absorptance of the device of FIG. 8 (according to one or more embodiments of the present invention) with Cr layers with the device comprising black chrome [3], the MDPhC device [2], and a YSZ cermet device [7].

Process Steps

Figure 12:
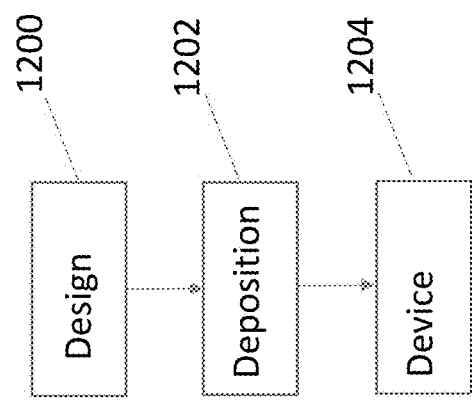
FIG. 12 is a flowchart illustrating a method of fabricating a thermal absorber according to one or more embodiments of the present invention.

FIG. 12 illustrates fabrication of a semiconductor-dielectric device, according to one or more embodiments of the invention, may require two stages.

Block 1200 represents the first, stage, designing the device structure. In one or more embodiments, the first stage comprises the computational simulation/optimization of a one-dimensional structure, e.g., wherein a needles method is used to optimize the relative order and thickness of each layer, and the transfer matrix method is used to calculate the total absorptance of the structure [6].

The step can comprise selecting dielectric layers (comprising e.g., ZnS and $CaF_2$) that are transparent to infrared radiation and have sufficient refractive index contrast, and selecting the semiconductor absorber layers (comprising e.g., amorphous silicon or germanium) having a band gap, such that the semiconductor absorber layers absorb at least a portion of the solar spectrum (including visible light) and the stack reflects infrared radiation. The semiconductor for the absorber layer can be selected such that its bandgap is close to the critical wavelength. For example, gallium antimonide (GaSb) would also work in theory. For IR transparent dielectrics, $CaF_2$ is most likely irreplaceable. Potassium bromide (KBr) might work, but it is unstable in air. Zinc selenide (ZnSe) could replace ZnS.

The step can comprise selecting a number (and material(s)) of the dielectric layers, one or more thicknesses of the dielectric layers, a number (and material(s)) of the semiconductor absorber layers, one or more thicknesses of the semiconductor absorber layers, refractive indices of the layers, and/or positioning of the semiconductor absorber layers and the dielectric layers relative to one another, such that:

absorptance of the stack comprising the dielectric layers and the semiconductor absorber layers decreases by at least 80% as the wavelength of the incident electromagnetic radiation is increased over a wavelength range of at most 500 nanometers centered on an absorptance cut-off wavelength or boundary 704 between an absorptance pass band and absorptance stop band (see FIG. 3, 7, 10, or 11) of the structure; and/or reflectance of the stack increases by at least 80% as the wavelength of the incident electromagnetic radiation is increased over a wavelength range of at most 100 nanometers centered on a reflectance cut-off wavelength or boundary 500 between a reflectance pass band and reflectance stop band (see FIG. 5) of the structure; and the cut-off wavelengths for the absorptance and the reflectance (which may be the same) are within 700 nm, within 500 nm, or within 200 nm of the critical wavelength $\lambda_c$, e.g., no more than 700 nm less than, no more than 500 nm less than, or no more than 200 nm less than $\lambda_c$ (where $\lambda_c$ can be e.g., at least 1.6 micrometers or 1.8 micrometers, see e.g., FIG. 3, 5, 7, 10, or 11).

The filter can be designed so that at least some of the out-of-band wavelengths (having wavelengths at or longer than the critical wavelength) lie in the filter's stop band(s) and at least some of the in-band wavelengths (having the wavelengths shorter than the critical wavelength, e.g., visible wavelengths in a range of 390-700 nm) lie in the filter's pass band(s). For example, the filter can be a Fabry-Perot filter or a photonic bandgap filter. For example, the dielectric layers and semiconductor absorber layers can be dimensioned and structured to constructively phase-match reflection of the out-of-band electromagnetic radiation (having wavelengths greater than $\lambda_c$) by the stack (so as to filter out and reflect the out-of-band electromagnetic radiation away from the semiconductor absorber layers).

Versions of the device can comprise the following pattern:
(1) region 1 (1 in FIGS. 2 and 8) comprising alternating first and second dielectric layers comprising different materials (e.g., alternating CaF$_2$ and ZnS), e.g., so that the first dielectric layer (e.g., ZnS) is between two of the second dielectric layers (e.g., CaF$_2$), and
(2) region 2 (2 in FIGS. 2 and 8) comprising alternating (e.g., second) dielectric layer (e.g., CaF$_2$) and semiconductor layer (Ge or Si), i.e., layers alternating between one of the (e.g., second) dielectric layers and one of the semiconductor absorbing layers.
(3) region 3 (3 in FIGS. 2 and 8), comprising the metal reflector, such that region 2 is between region 1 and region 3. In a further version of the device, chromium (Cr) can be used as stabilization layers that sandwich the metal (Ag) layer. Thus, in or more embodiments, region 3 ("metal region") can comprise |Cr|Ag|Cr|.

The Cr does two things: 1) it is a "sticky" metal that helps bond the Ag to the Si substrate; and 2) it protects the Ag and the Ge from one another. Ag and Ge diffuse well within one another but do not diffuse well through Cr. Another material that might work would be Titanium (Ti), which is also kind of "sticky", but Cr is better at reflecting IR light than Ti.

The semiconductor absorber layer closest to the metal reflector 200a and/or the semiconductor absorber layer 200c closest to the first region can both be thinner than the remaining semiconductor absorber layers 200b, as illustrated in FIG. 2. The dielectric layer 800a closest to the metal reflector 808, and the dielectric layer 800e closest to a top surface of the first region on which the electromagnetic radiation is incident, can both be thicker than the remaining dielectric layers 800b, 800c, as illustrated in FIGS. 2 and 8.

In one or more embodiments (e.g., as illustrated in FIG. 2), the semiconductor absorber layers comprise a first semiconductor absorber layer 200a, a second semiconductor absorber layer 200b, and a third semiconductor absorber layer 200c; the dielectric layers comprise a ZnS layer 202, a first CaF$_2$ layer 204a, a second CaF$_2$ layer 204b, a third CaF$_2$ layer 204c, and a fourth CaF$_2$ layer 204d; the first semiconductor absorber layer 200a (e.g., thickness of 20-50 nm) is on a metal reflector (e.g., comprising silver); the first CaF$_2$ layer 204a (e.g., thickness of 50-120 nm) is on the first semiconductor absorber layer 200a; the second semiconductor absorber layer 200b (e.g., thickness of 50-100 nm) is on the first CaF$_2$ layer 204a; the second CaF$_2$ layer 204b (e.g., thickness of 10-50 nm) is on the second semiconductor absorber layer 200b; the third semiconductor absorber layer 200c (e.g., thickness of 1-10 nm) is on the second CaF$_2$ layer 204b; the third CaF$_2$ layer 204c (e.g., thickness of 10-50 nm) is on the third semiconductor absorber layer 200c; the ZnS layer 202 is on the third CaF$_2$ layer 204c; and the fourth CaF$_2$ layer 204d (e.g., thickness of 50-100 nm) is on the ZnS layer 202 (e.g., thickness of 1-50 nm).

In one or more further embodiments (e.g., as illustrated in FIG. 8), the dielectric layers comprise a first CaF$_2$ layer 800a, a second CaF$_2$ layer 800b, a third CaF$_2$ layer 800c, a fourth CaF$_2$ layer 800d, a fifth CaF$_2$ layer 800e, and a ZnS layer 802; the semiconductor absorber layers comprise a first semiconductor absorber layer 804a, a second semiconductor absorber layer 804b, a third semiconductor absorber layer 804c, and a fourth semiconductor absorber layer 804d; the first semiconductor absorber layer 804a (e.g., thickness of 20-80 nm) is on or above metal layers comprising a metal layer 808 (e.g. Ag, e.g. having a thickness of 50-200 nm) sandwiched between Cr layers 810a-810b (e.g., each having a thickness of 1-50 nm); the first CaF$_2$ layer 800a (e.g., thickness of 100-300 nm) is on the first semiconductor absorber layer 804a; the second semiconductor absorber layer 804b (e.g., thickness of 20-50 nm) is on the first CaF$_2$ layer 800a; the second CaF$_2$ layer 800b (e.g., thickness of 20-70 nm) is on the second semiconductor absorber layer 804b; the third semiconductor absorber layer 804c (e.g., thickness of 20-70 nm) is on the second CaF$_2$ layer 800b; the third CaF$_2$ layer 800c (e.g., thickness of 50-100 nm) is on the third semiconductor absorber layer 804c; the fourth semiconductor absorber layer 804d (e.g., thickness of 1-10 nm) is on the third CaF$_2$ layer 800c, the fourth CaF$_2$ layer 800d (e.g., thickness of 10-50 nm) is on the fourth semiconductor absorber layer 804d, the ZnS layer 802 is on the fourth CaF$_2$ layer 804d; and the fifth CaF$_2$ layer 800e (e.g., thickness of 70-200 nm) is on the ZnS layer 802 (e.g., thickness of 1-20 nm).

Block 1202 represents the next stage, depositing the layers, which can comprise sputtering the materials. Due to limitations in availability, the initial prototypes incorporated SiO$_2$ instead of CaF$_2$, although one or more embodiments of the invention have successfully fabricated a device with CaF$_2$. The deposition rates for Ag, aSi, SiO$_2$ and ZnS are largely constant, so it is a straightforward matter to develop a sputtering schedule to achieve the desired profile. The dielectrics and semiconductors are sputtered using radio-frequency (RF) power and the metals are sputtered using direct current (DC). The CaF$_2$ is sputtered at low power (~50

Watts (W)) since the CaF$_2$ target is fragile. The other materials are sputtered at powers ranging from 90 W to 150 W.

Block 1204 represents the end result, a thermal absorber comprising a spectrally selective filter comprising a stack of dielectric layers and one or more semiconductor absorber layers.

Advantages and Improvements

Building off of modern photonics and developments in thin-film deposition, the semiconductor dielectric photonic solar thermal absorber according to one or more embodiments of the invention improves upon previous devices in at least two critical areas: 1) By incorporating IR-transparent dielectrics with sufficient refractive index contrast, such as ZnS and CaF$_2$, the device can better absorb visible light while still reflecting the infra-red (this is critical, devices according to one or more embodiments show unprecedented low thermal emittance, meaning the devices can be used in systems with un-concentrated sunlight); and 2) using a direct "optical-gap" semiconductor, such as amorphous silicon, allows for a much steeper decrease in absorptance at the critical wavelength, as the absorption coefficient is of the form α

$$\alpha \propto \sqrt{\sqrt{\frac{hc}{\lambda} - Eg}},$$

which drops sharply to zero near the band gap Eg (h is Planck's constant, c is speed of light, and λ is wavelength). However, results [7] have also achieved a sharp drop in absorptance without using a direct-gap semiconductor.

REFERENCES

The following references are incorporated by reference herein.

1] F. Cao et al. A review of cermet-based spectrally selective solar absorbers. Energy & Environmental Science, 7(5): 1615-1627, 2014.
[2] Jeffrey B. Chou et al. Enabling ideal selective solar absorption with 2d metallic dielectric photonic crystals. Advanced Materials, 26(47):8041-8045, 2014.
[3] Y. Yin et al. Direct current reactive sputtering Cr—Cr$_2$O$_3$ cermet solar selective surfaces for solar hot water applications. Thin Solid Films, 517(5):1601-1606, 2009.
[4] D. C. Booth et al. Stabilized CVD amorphous silicon for high-temperature photothermal solar-energy conversion. Solar Energy Materials, 2(1):107-124, 1979.
[5] D. E. Ackley et al. Silicon films as selective absorbers for solar energy conversion. Applied Optics, 16 (11):2806-2809, 1977.
[6] Alexander V. Tikhonravov et al. Application of the needle optimization technique to the design of optical coatings. Applied Optics, 35(28):5493-5508, 1996.
[7] Cao, F., et al. Energy & Environmental Science 8(10): 3040-3048, 2015.

CONCLUSION

This concludes the description of the preferred embodiment of the present invention. The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A solar thermal absorber, comprising:
   a stack of dielectric layers and one or more semiconductor absorber layers on a metal reflector, wherein:
   the dielectric layers are transparent to infrared radiation and have a refractive index contrast, and
   the semiconductor absorber layers comprise amorphous silicon or amorphous germanium and have a band gap, such that the semiconductor absorber layers absorb visible light and the stack reflects infrared radiation so as to suppress emission of black-body radiation.

2. The absorber of claim 1, wherein the layers are sputtered on the metal reflector.

3. The absorber of claim 2, wherein the metal reflector comprises Ag sandwiched between Cr layers.

4. The absorber of claim 1, wherein the dielectric layers comprise one or more ZnS layers and one or more CaF$_2$ layers.

5. The absorber of claim 1, wherein:
   the dielectric layers comprise a ZnS layer, a first CaF$_2$ layer, a second CaF$_2$ layer, a third CaF$_2$ layer, and a fourth CaF$_2$ layer;
   the semiconductor absorber layers comprise a first semiconductor absorber layer, a second semiconductor absorber layer, and a third semiconductor absorber layer;
   the first semiconductor absorber layer is on the metal reflector;
   the first CaF$_2$ layer is on the first semiconductor absorber layer;
   the second semiconductor absorber layer is on the first CaF$_2$ layer;
   the second CaF$_2$ layer is on the second semiconductor absorber layer;
   the third semiconductor absorber layer is on the second CaF$_2$ layer;
   the third CaF$_2$ layer is on the third semiconductor absorber layer;
   the ZnS layer is on the third CaF$_2$ layer; and
   the fourth CaF$_2$ layer is on the ZnS layer.

6. The absorber of claim 5, wherein:
   the first semiconductor absorber layer has a thickness of 20-80 nm,
   the second semiconductor absorber layer has a thickness of 20-100 nm,
   the third semiconductor absorber layer has a thickness of 1-70 nm,
   the first CaF$_2$ layer has a thickness of 50-300 nm,
   the second and third CaF$_2$ layers each have thicknesses between 10-70 nm,
   the fourth CaF$_2$ layer has a thickness of 50-100 nm, and
   the ZnS layer has a thickness of 1-50 nm.

7. The absorber of claim 5, wherein the metal reflector is a silver reflector sandwiched between Cr layers.

8. The absorber of claim 1, wherein:
   the dielectric layers comprise a first CaF$_2$ layer, a second CaF$_2$ layer, a third CaF$_2$ layer, a fourth CaF$_2$ layer, a fifth CaF$_2$ layer, and a ZnS layer;
   the semiconductor absorber layers are amorphous germanium layers comprising a first semiconductor absorber layer, a second semiconductor absorber layer, a third semiconductor absorber layer, and a fourth semiconductor absorber layer;

the first semiconductor absorber layer is on or above metal layers comprising a silver layer sandwiched between chromium layers;

the first $CaF_2$ layer is on the first semiconductor absorber layer;

the second semiconductor absorber layer is on the first $CaF_2$ layer;

the second $CaF_2$ layer is on the second semiconductor absorber layer;

the third semiconductor absorber layer is on the second $CaF_2$ layer;

the third $CaF_2$ layer is on the third semiconductor absorber layer;

the fourth semiconductor absorber layer is on the third $CaF_2$ layer;

the fourth $CaF_2$ layer is on the fourth semiconductor absorber layer;

the ZnS layer is on the fourth $CaF_2$ layer; and the fifth $CaF_2$ layer is on the ZnS layer.

9. A thermal absorber, comprising:

a spectrally selective filter comprising a stack of dielectric layers transparent to infrared radiation and one or more semiconductor absorber layers, wherein:

the filter receives electromagnetic radiation, the electromagnetic radiation comprising in-band electromagnetic radiation having wavelengths less than a critical wavelength and out-of-band electromagnetic radiation having wavelengths at or longer than the critical wavelength, the critical wavelength defined such that black body radiation, having wavelengths at or longer than the critical wavelength, is emitted from the semiconductor absorber layers with an intensity that exceeds an intensity of the out-of-band electromagnetic radiation absorbed by the semiconductor absorber layers; and the dielectric layers and the semiconductor absorber layers have a refractive index contrast, the semiconductor absorber layers have a band gap, and the dielectric layers have a transparency such that:

absorptance of the stack decreases by at least 80% as wavelength of the electromagnetic radiation increases over a wavelength range of 500 nanometers centered on a boundary between an absorptance pass band and an absorptance stop band of the filter, reflectance of the stack increases by at least 80% as wavelength of the electromagnetic radiation increases over a wavelength range of 100 nanometers centered on a boundary between a reflectance pass band and an reflectance stop band of the filter, and the boundaries are no more than 500 nm less than the critical wavelength, thereby suppressing emission of the black-body radiation and allowing the semiconductor absorber layers to generate thermal energy by increasing in temperature in response to absorbing the in-band electromagnetic radiation.

10. The absorber of claim 9, wherein the in-band electromagnetic radiation comprises wavelengths of the solar spectrum and the out-of-band electromagnetic radiation includes infrared wavelengths.

11. The absorber of claim 9, wherein the critical wavelength is at least 1.6 micrometers.

12. The absorber of claim 9, wherein the stack comprises layers alternating between one of the dielectric layers and one of the semiconductor absorbing layers.

13. The absorber of claim 9, wherein the dielectric layers comprise one or more ZnS layers and one or more $CaF_2$ layers.

14. The absorber of claim 9, wherein the dielectric layers comprise one or more first dielectric layers comprising a first dielectric material and one or more second dielectric layers comprising a second dielectric material, the absorber further comprising:

a first region including one of the first dielectric layers between two of the second dielectric layers, and a second region including layers alternating between one of the second dielectric layers and one of the semiconductor absorbing layers, a metal reflector positioned such that the second region is between the first region and the metal reflector, and wherein the electromagnetic radiation is incident on the first region.

15. The absorber of claim 14, wherein:

the first dielectric layer comprises at least one dielectric selected from ZnS and ZnSe, the second dielectric layer comprises at least one dielectric selected from $CaF_2$ and KBr, and the semiconductor absorber layer comprises at least one semiconductor selected from amorphous silicon, amorphous germanium, and GaSb.

16. The absorber of claim 14, wherein:

the semiconductor absorber layer closest to the metal reflector and the semiconductor absorber layer closest to the first region are both thinner than the remaining semiconductor absorber layers, and the dielectric layer closest to the metal reflector, and the dielectric layer closest to a top surface of the first region on which the electromagnetic radiation is incident, are both thicker than the remaining dielectric layers.

17. The absorber of claim 9, wherein the filter is a Fabry-Perot filter or a photonic bandgap filter.

18. A method of fabricating a thermal absorber, comprising:

depositing a spectrally selective filter, including depositing a stack of dielectric layers and one or more semiconductor absorber layers on a metal reflector, wherein the dielectric layers comprise one or more ZnS layers and one or more $CaF_2$ layers and the semiconductor absorber layers comprise amorphous silicon or germanium.

19. The method of claim 18, wherein the depositing comprises sputtering.

* * * * *